United States Patent
Bhatia et al.

(10) Patent No.: US 10,846,172 B2
(45) Date of Patent: Nov. 24, 2020

(54) ENCODING METHOD AND SYSTEM FOR MEMORY DEVICE INCLUDING QLC CELLS

(71) Applicant: SK hynix Inc., Gyeonggi-do (KR)

(72) Inventors: Aman Bhatia, San Jose, CA (US); Naveen Kumar, San Jose, CA (US); Fan Zhang, San Jose, CA (US)

(73) Assignee: Sk hynix Inc., Gyeonggi-do (KR)

( * ) Notice: Subject to any disclaimer, the term of this patent is extended or adjusted under 35 U.S.C. 154(b) by 0 days.

(21) Appl. No.: 16/240,266

(22) Filed: Jan. 4, 2019

(65) Prior Publication Data

US 2019/0213074 A1     Jul. 11, 2019

Related U.S. Application Data

(60) Provisional application No. 62/614,844, filed on Jan. 8, 2018.

(51) Int. Cl.
*G06F 11/10* (2006.01)
*H03M 13/29* (2006.01)
(Continued)

(52) U.S. Cl.
CPC ...... *G06F 11/1072* (2013.01); *G06F 11/1004* (2013.01); *G11C 7/1006* (2013.01); *G11C 11/5628* (2013.01); *G11C 11/5642* (2013.01); *G11C 29/42* (2013.01); *G11C 29/52* (2013.01); *H03M 13/05* (2013.01); *H03M 13/2909* (2013.01); *G11C 2029/0411* (2013.01); *G11C 2211/5641* (2013.01); *H03M 13/1102* (2013.01);
(Continued)

(58) Field of Classification Search
CPC ............. G06F 11/1072; G06F 11/1004; G11C 7/1006; G11C 11/5628; G11C 11/5642; G11C 29/42; G11C 29/52; G11C 2211/5641; H03M 13/05; H03M 13/2909
See application file for complete search history.

(56) References Cited

U.S. PATENT DOCUMENTS

| | | | | |
|---|---|---|---|---|
| 5,896,419 A | * | 4/1999 | Suzuki | H04L 1/0054 375/219 |
| 9,536,600 B2 | * | 1/2017 | Kim | G11C 11/5628 |

(Continued)

OTHER PUBLICATIONS

Taranalli, V. et al., Error Analysis and Inter-Cell Interference Mitigation in Multi-Level Cell Flash Memories, 2015.
(Continued)

*Primary Examiner* — April Y Blair
*Assistant Examiner* — Sazzad Hossain
(74) *Attorney, Agent, or Firm* — IP & T Group LLP

(57) ABSTRACT

Encoding methods and systems are provided for a memory device including quadruple-level cell (QLC) memory cells. A controller of a memory system includes a first encoder and a second encoder. The first encoder encodes, based on a constrained code, a first group of data to generate a third group of data, the first group of data corresponding to first and third logical pages among a plurality of logical pages. The second encoder encodes, based on a Gray code, a second group of data and the third group of data to generate encoded sequences corresponding to a plurality of program-voltage (PV) levels, the second group of data corresponding to the second and fourth logical pages among the plurality of logical pages.

20 Claims, 11 Drawing Sheets

(51) Int. Cl.
*G11C 11/56* (2006.01)
*G11C 7/10* (2006.01)
*G11C 29/52* (2006.01)
*G11C 29/42* (2006.01)
*H03M 13/05* (2006.01)
H03M 13/15 (2006.01)
H03M 13/11 (2006.01)
H03M 13/25 (2006.01)
G11C 29/04 (2006.01)

(52) U.S. Cl.
CPC ...... *H03M 13/152* (2013.01); *H03M 13/1515* (2013.01); *H03M 13/251* (2013.01)

(56) References Cited

U.S. PATENT DOCUMENTS

| | | |
|---|---|---|
| 2011/0213930 A1 | 9/2011 | Park et al. |
| 2013/0238959 A1 | 9/2013 | Birk et al. |
| 2017/0371565 A1* | 12/2017 | Liu ........................ G06F 3/0613 |
| 2018/0226990 A1* | 8/2018 | Li ........................ H03M 13/1111 |
| 2018/0349645 A1* | 12/2018 | Helmick ............ G11B 20/1833 |

OTHER PUBLICATIONS

Immink, K. A. S., Codes for Mass Data Storage Systems, Second Edition, 2004, Shannon Foundation Publishers, Eindhoven, The Netherlands.
Mittelholzer, T. et al., Reverse Concatenation of Product and Modulation Codes, 2008, IEEE.

\* cited by examiner

FIG. 8

|  | PV15 – PV0 – PV15 | | | PV15 – PV0 – PV14 | | | PV14 – PV0 – PV15 | | | PV14 – PV0 – PV14 | | |
|---|---|---|---|---|---|---|---|---|---|---|---|---|
| MSB  | 1 | 1 | 1 | 1 | 1 | 1 | 1 | 1 | 1 | 1 | 1 | 1 |
| MCSB | 1 | 1 | 1 | 1 | 1 | 0 | 0 | 1 | 1 | 0 | 1 | 0 |
| LCSB | 0 | 1 | 0 | 0 | 1 | 0 | 0 | 1 | 0 | 0 | 1 | 0 |
| LSB  | 1 | 1 | 1 | 1 | 1 | 1 | 1 | 1 | 1 | 1 | 1 | 1 |

|  | PV15 – PV1 – PV15 | | | PV15 – PV1 – PV14 | | | PV14 – PV1 – PV15 | | | PV14 – PV1 – PV14 | | |
|---|---|---|---|---|---|---|---|---|---|---|---|---|
| MSB  | 1 | 1 | 1 | 1 | 1 | 1 | 1 | 1 | 1 | 1 | 1 | 1 |
| MCSB | 1 | 1 | 1 | 1 | 1 | 0 | 0 | 1 | 1 | 0 | 1 | 0 |
| LCSB | 0 | 1 | 0 | 0 | 1 | 0 | 0 | 1 | 0 | 0 | 1 | 0 |
| LSB  | 1 | 0 | 1 | 1 | 0 | 1 | 1 | 0 | 1 | 1 | 0 | 1 |

ENCODING METHOD AND SYSTEM FOR MEMORY DEVICE INCLUDING QLC CELLS

CROSS-REFERENCE TO RELATED APPLICATION

This application claims the benefit of U.S. Provisional Application No. 62/614,844, filed on Jan. 8, 2018, the entire contents of which are incorporated herein by reference.

BACKGROUND

1. Field

Embodiments of the present disclosure relate to an encoding scheme for a memory device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSDs). Memory systems use various encoding schemes for memory cells.

SUMMARY

Aspects of the present invention include encoding methods and systems for a memory device including quadruple-level cell (QLC) memory cells.

In one aspect, a memory system includes a memory device including quadruple-level cells (QLCs), and a controller. The controller includes a first encoder and a second encoder. The first encoder encodes, based on a constrained code, a first group of data to generate a third group of data, the first group of data corresponding to first and third logical pages among a plurality of logical pages. The second encoder encodes, based on a Gray code, a second group of data and the third group of data to generate encoded sequences corresponding to a plurality of program-voltage (PV) levels, the second group of data corresponding to the second and fourth logical pages among the plurality of logical pages.

In another aspect, a method for operating a memory system including a memory device including quadruple-level cells (QLCs) includes: encoding, based on a constrained code, a first group of data to generate a third group of data, the first group of data corresponding to first and third logical pages among a plurality of logical pages; and encoding, based on a Gray code, a second group of data and the third group of data to generate encoded sequences corresponding to a plurality of program-voltage (PV) levels, the second group of data corresponding to the second and fourth logical pages among the plurality of logical pages.

Additional aspects of the present invention will become apparent from the following description.

BRIEF DESCRIPTION OF THE DRAWINGS

FIG. 8 is a diagram illustrating inter-cell interference in a memory device using Gray code of FIG. 7.

DETAILED DESCRIPTION

Figure 1:
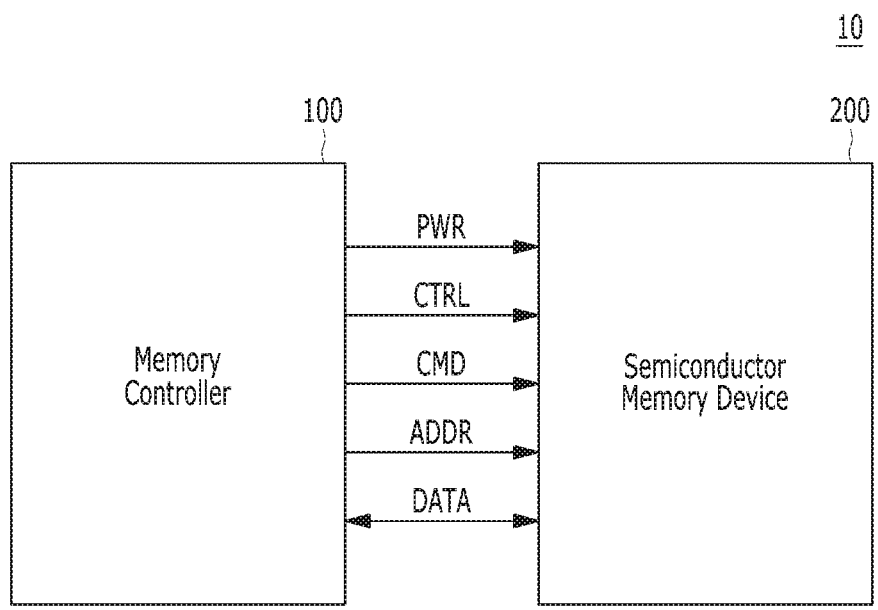
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a memory system 10 in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to form a PC card of personal computer memory card international association (PCMCIA a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
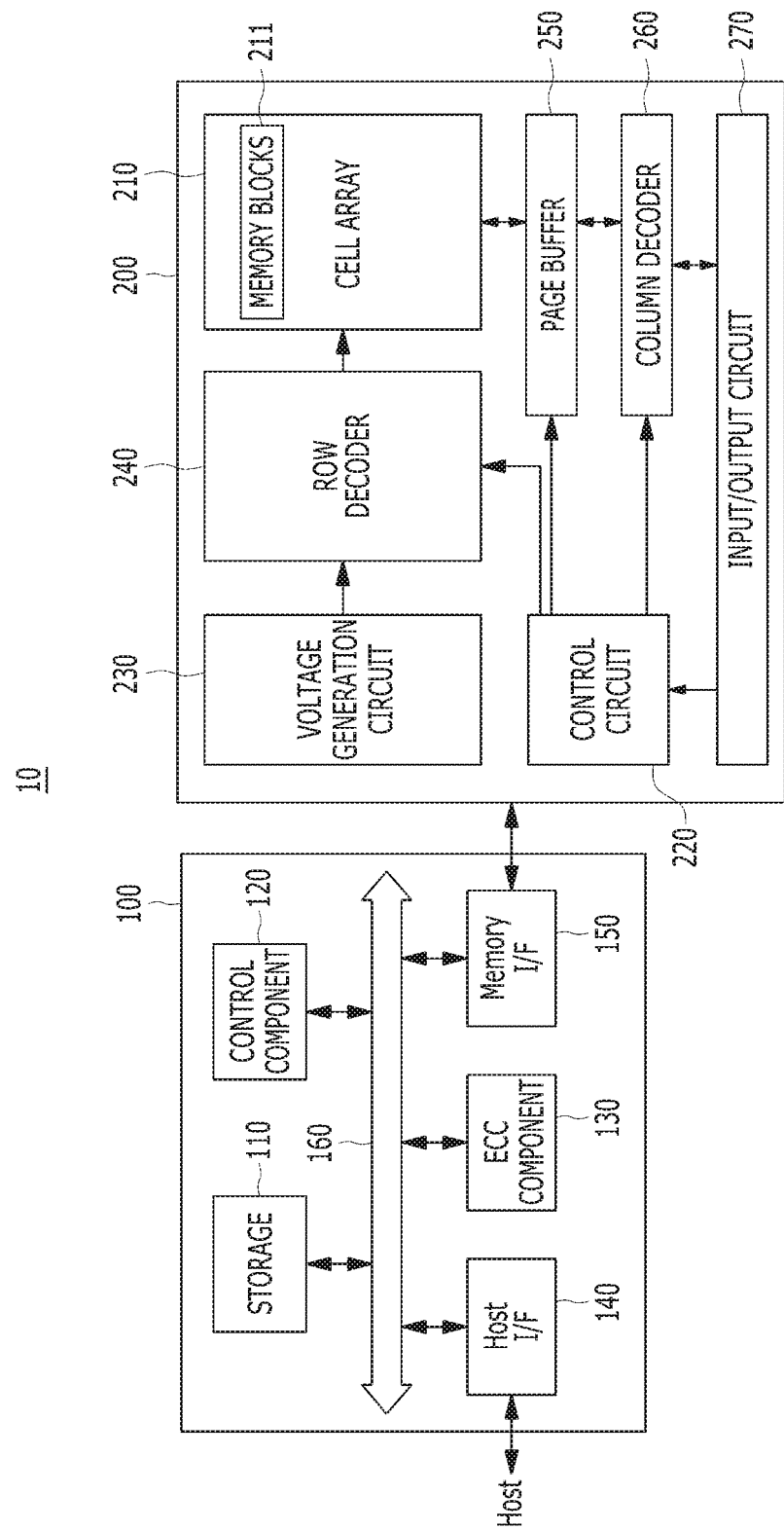
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-e), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), and non-volatile memory express (NVMe).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
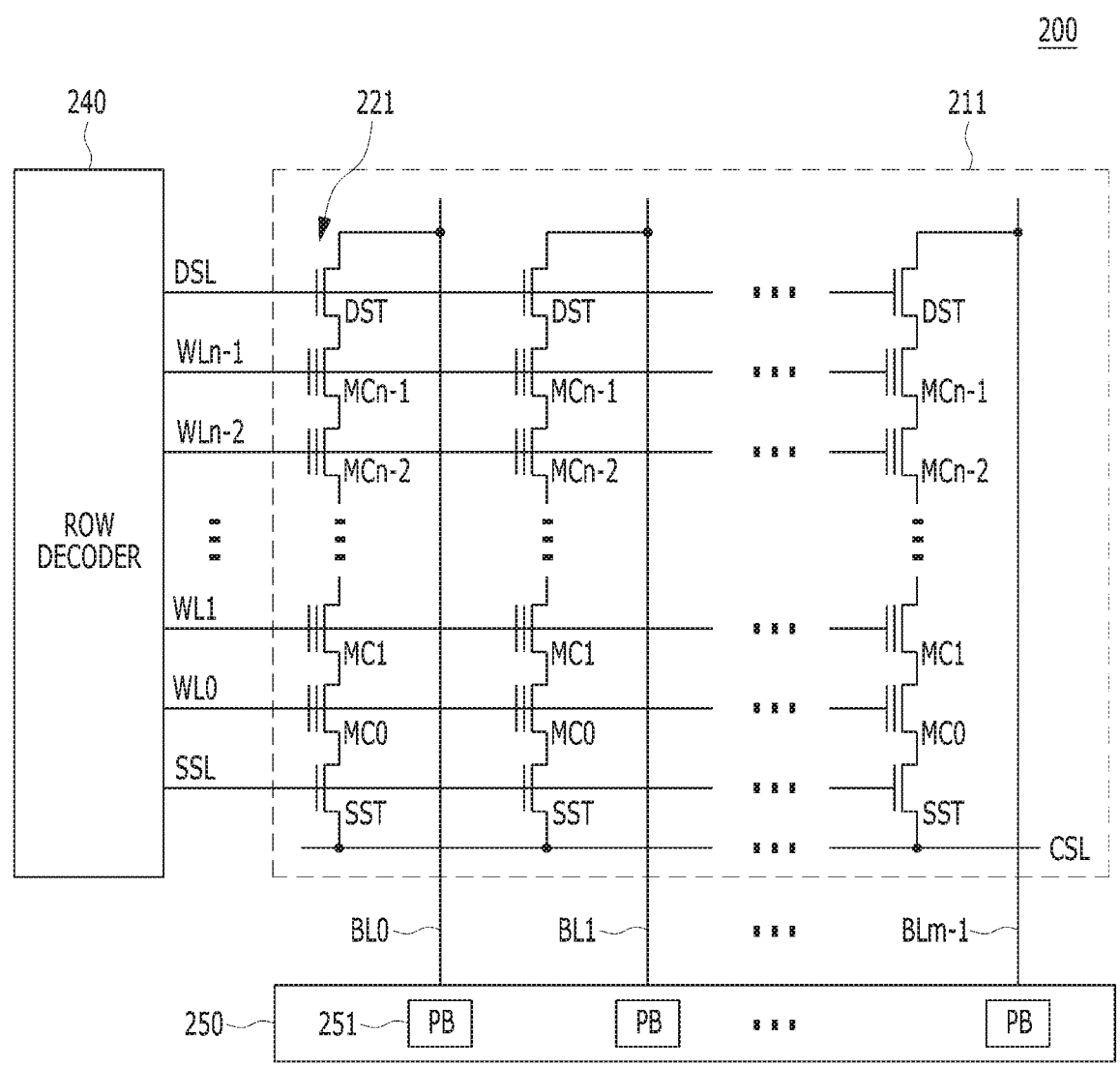
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
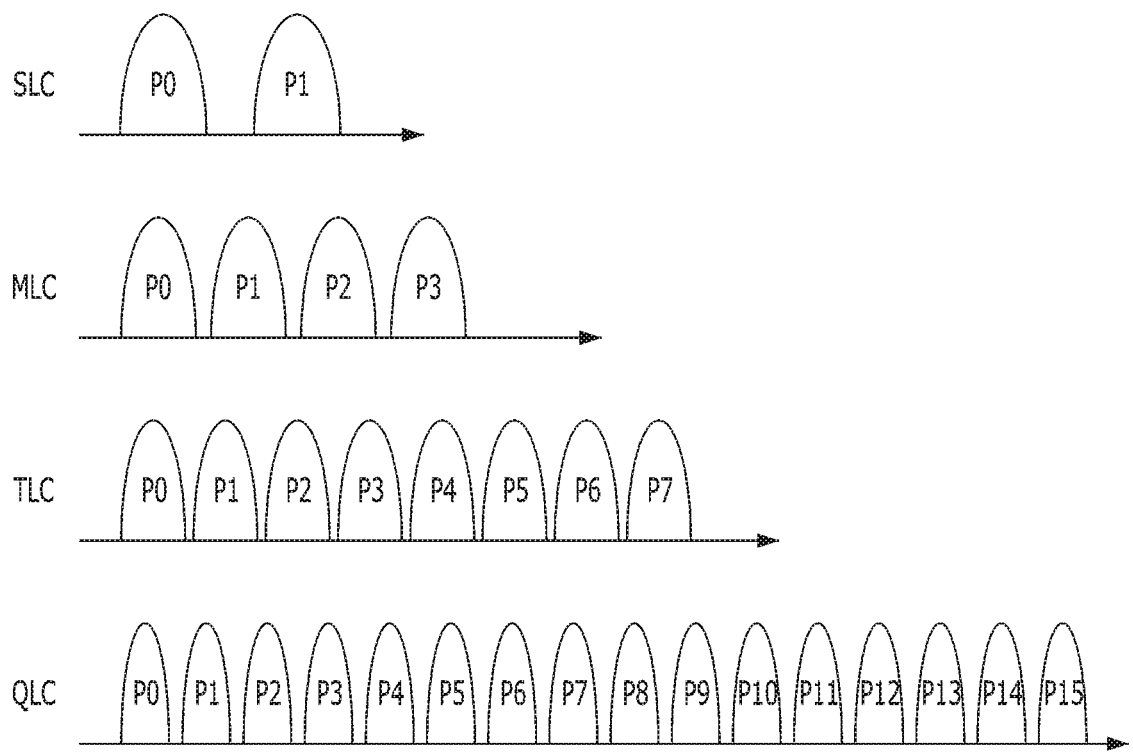
FIG. 4 is a diagram illustrating states for cells of a memory device.

FIG. 4 is a diagram illustrating distributions of program states or voltage levels for cells of a memory device.

Referring to FIG. 4, each of memory cells may be implemented with a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

Memory cells of SLC may include two states P0 and P1. P0 may indicate an erase state, and P1 may indicate a program state. Since the memory cells of SLC can be set in one of two different states, each of the memory cells may program or store 1 bit according to a set coding method. Memory cells of MLC may include four states P0, P1, P2 and P3. Among these states, P0 may indicate an erase state, and P1 to P3 may indicate program states. Since the memory cells of MLC can be set in one of four different states, each of the memory cells may program or store two different bits according to a set coding method. Memory cells of TLC may include eight states P0 to P7. Among these states, P0 may indicate an erase state, and P1 to P7 may indicate program states. Since the memory cells of TLC can be set in one of eight different states, each of the memory cells may program or store three different bits according to a set coding method. Memory cells of QLC may include 16 states P0 to P15. Among these states, P0 may indicate an erase state, and P1 to P15 may indicate program states. Since the memory cells of QLC can be set in one of sixteen different states, each of the memory cells may program or store four different bits according to a set coding method.

Figure 5:
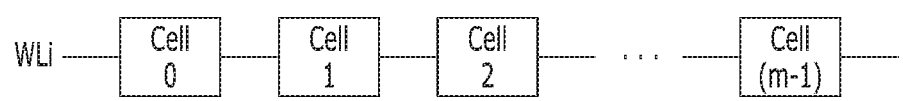
FIG. 5 is a diagram illustrating cells of a memory device.

FIG. 5 is a diagram illustrating cells of a memory device. Referring to FIG. 5, the memory device may include a plurality of memory cells Cell 0 to Cell (m-1), which are coupled to a word line WLi.

Figure 6:
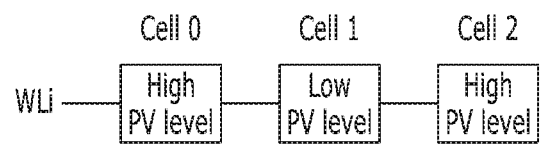
FIG. 6 is a diagram for describing inter-cell interference in a memory device.

FIG. 6 is a diagram for describing inter-cell interference (ICI) in a memory device.

Referring to FIG. 6, when data is read from the memory device (e.g., NAND flash memory) including memory cells Cell 0 to Cell 2 coupled to a word line WLi, errors may occur. A major source of errors in the data read from the NAND flash memory may be inter-cell interference. When a cell (e.g., Cell 1) in a low program-voltage (PV) level is surrounded by cells (e.g., Cell 0 and Cell 2) in high PV levels, a read reference (or threshold) voltage level of the cell in the low PV level may increase, causing it to be read back as the higher PV level.

Figure 7:
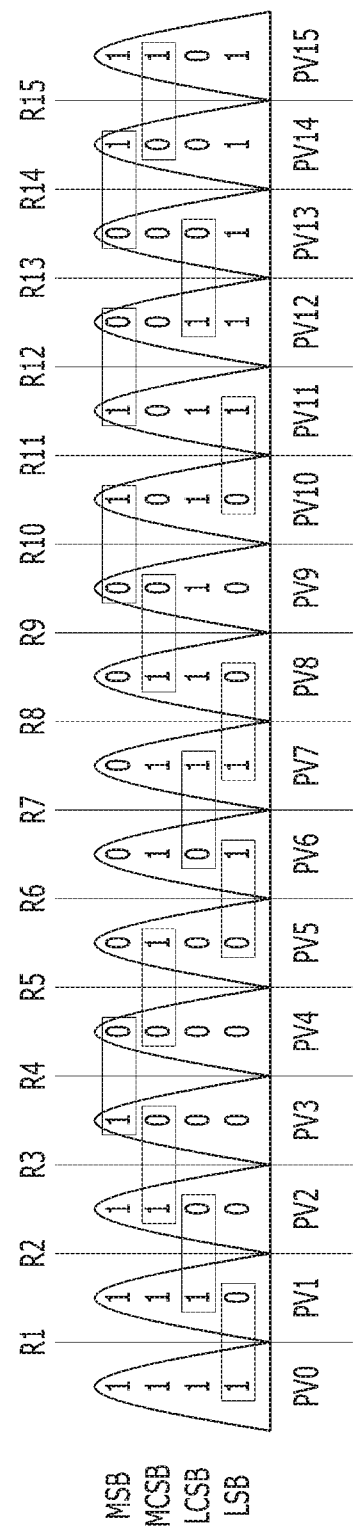
FIG. 7 is a diagram illustrating an example of Gray code for mapping between program-voltage levels and logical pages for a quadruple-level cell (QLC).

FIG. 7 is a diagram illustrating an example of Gray code for mapping between program-voltage (PV) levels and logical pages for a quadruple-level cell (QLC).

Referring to FIG. 7, QLC memory cells may store information (or data) in sixteen possible program-voltage (PV) levels PV0 to PV15. Each of these sixteen PV levels may be mapped to a unique 4-bit vector. Gray mapping may be used so that the mapping for adjacent PV levels differ by exactly one bit, as shown in FIG. 7. A physical page in a memory device including QLC, i.e., a collection of cells may be divided into four logical pages: a first page as a most significant bit (MSB) page, a second page as a most center significant bit (MCSB) page, a third page as a least center significant bit (LCSB) page and a fourth page as a least significant bit (LSB) page. The logical pages may be encoded and/or decoded independently for best possible random read performance.

Referring again to FIG. 6, when a cell (e.g., Cell 1) in the low PV level is surrounded by cells (e.g., Cell 0 and Cell 2) in high PV levels, due to inter-cell interference, a read reference (or threshold) voltage level of the cell (e.g., Cell 1) in the low PV level may increase.

FIG. 8 is a diagram illustrating sequences of program-voltage (PV) levels in consecutive cells of a memory device using Gray code of FIG. 7, which may cause errors in read data due to inter-cell interference.

Referring to FIG. 8, when a cell in a low PV level is surrounded by cells in high PV levels, inter-cell interference may occur. The low PV levels may include PV levels PV0 and PV1, and the high PV levels may include PV levels PV14 and PV15. Further, the low PV levels may include PV levels PV2 and PV3, and the high PV levels may include PV levels PV12 and PV13. The following list represents examples of sequences of PV levels in consecutive cells, that may cause errors in read data:

| | |
|---|---|
| PV15-PV0-PV15 | PV14-PV0-PV14 |
| PV15-PV1-PV15 | PV14-PV1-PV14 |
| PV15-PV0-PV14 | PV15-PV0-PV13 |
| PV15-PV1-PV14 | PV13-PV0-PV15 |
| PV14-PV0-PV15 | PV15-PV1-PV13 |
| PV14-PV1-PV15 | PV13-PV1-PV13 |

Sequences of PV levels causing inter-cell interference (ICI) have certain patterns of some pages (i.e., a most significant bit (MSB) page and a least center significant bit (LCSB page)) of all logical pages. In other words, the sequences of PV levels causing inter-cell interference (ICI) have certain patterns of the MSB page "111" and the LCSB page "010" as depicted as dotted boxes.

Thus, it is required to provide schemes to reduce the number of cells in error as such. It is important to provide constrained coding schemes such that the encoded sequences do not cause such inter-cell interference. Furthermore, it is important to maintain good random read performance when encoding and/or decoding to address inter-cell interference.

Embodiments of the present invention provide a scheme for mapping program-voltage (PV) levels of a quadruple-level cell (QLC) memory cell into four logical pages, such that the logical pages are balanced in the number and quality of the sensing operations required to perform a read operation. Moreover, the chosen Gray mapping allows identification of harmful inter-cell interference (ICI) patterns using only two out of the four logical pages. To minimize random read performance degradation, embodiments of the present invention perform constrained coding across two logical pages to avoid some of the harmful ICI patterns, leaving the other two logical pages without any constrained coding. Furthermore, it is beneficial to design an optimized Gray mapping such that all harmful ICI patterns can be forbidden with the high-rate constrained coding scheme. In other words, embodiments of the present invention provide a jointly designed Gray coding and constrained coding scheme such that many harmful ICI patterns may be eliminated completely with negligible rate loss and negligible read performance degradation.

Figure 9:
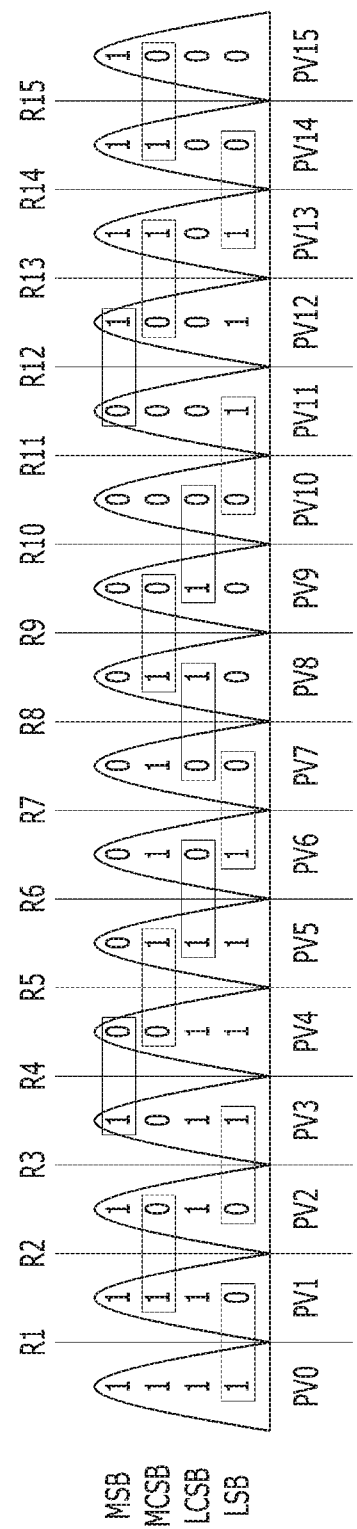
FIG. 9 is a diagram illustrating Gray code for mapping between program-voltage (PV) levels and logical pages for a quadruple-level cell (QLC) in accordance with an embodiment of the present invention.

FIG. 9 is a diagram illustrating Gray code for mapping between program-voltage (PV) levels and logical pages for quadruple-level cell (QLC) memory cells in accordance with an embodiment of the present invention.

Referring to FIG. 9, the sixteen PV levels PVC to PV15 may be mapped to four-bit vectors (or four bits of data), based on an optimized Gray code. The first bit belongs to a most significant bit (MSB) page as a first page. The second bit belongs to a most center significant bit (MCSB) page as a second page. The third bit belongs to a least center significant bit (LCSB) page as a third page. The fourth bit belongs to a least significant bit (LSB) page as a fourth page. The mapping satisfies the properties of Gray code, i.e., the bit representations of any two adjacent PV levels changes by one bit. The changed bit is highlighted in FIG. 9. For example, the fourth bit (i.e., "1") in PV0 is different from the fourth bit (i.e., "0") in PV1. The second bit (i.e., "1") in PV1 is different from the second bit (i.e., "0") in PV2. The fourth bit (i.e., "0") in PV2 is different from the fourth bit (i.e., "1") in PV3. The first bit (i.e., "1") in PV3 is different from the first bit (i.e., "0") in PV4. The second bit (i.e., "0") in PV4 is different from the second bit (i.e., "1") in PV5. The third bit (i.e., "1") in PV5 is different from the third bit (i.e., "0") in PV6. The fourth bit (i.e., "1") in PV6 is different from the fourth bit (i.e., "0") in PV7. The third bit (i.e., "0") in PV7 is different from the third bit (i.e., "1") in PV8. The second bit (i.e., "1") in PV8 is different from the second bit (i.e., "0") in PV9. The third bit (i.e., "1") in PV9 is different from the third bit (i.e., "0") in PV10. The fourth bit (i.e., "0") in PV10 is different from the fourth bit (i.e., "1") in PV11. The first bit (i.e., "0") in PV11 is different from the first bit (i.e., "1") in PV12. The second bit (i.e., "0") in PV12 is different from the second bit (i.e., "1") in PV13. The fourth bit (i.e., "1") in PV13 is different from the fourth bit (i.e., "0") in PV14. The second bit (i.e., "1") in PV14 is different from the second bit (i.e., "0") in PV15.

In various embodiments, as shown in FIG. 9, encoded sequences based an optimized Gray code have mapping relations between the 16 PV levels corresponding to the MSB, MCSB, LCSB and LSB pages as shown in the following Table 1:

TABLE 1

|  | MSB | MCSB | LCSB | LSB |
|---|---|---|---|---|
| PV0 | 1 | 1 | 1 | 1 |
| PV1 | 1 | 1 | 1 | 0 |
| PV2 | 1 | 0 | 1 | 0 |
| PV3 | 1 | 0 | 1 | 1 |
| PV4 | 0 | 0 | 1 | 1 |
| PV5 | 0 | 1 | 1 | 1 |
| PV6 | 0 | 1 | 0 | 1 |

TABLE 1-continued

|  | MSB | MCSB | LCSB | LSB |
|---|---|---|---|---|
| PV7 | 0 | 1 | 0 | 0 |
| PV8 | 0 | 1 | 1 | 0 |
| PV9 | 0 | 0 | 1 | 0 |
| PV10 | 0 | 0 | 0 | 0 |
| PV11 | 0 | 0 | 0 | 1 |
| PV12 | 1 | 0 | 0 | 1 |
| PV13 | 1 | 1 | 0 | 1 |
| PV14 | 1 | 1 | 0 | 0 |
| PV15 | 1 | 0 | 0 | 0 |

The following Table 2 shows sensing operations for all logical pages corresponding to the mapping scheme in FIG. 9.

TABLE 2

| Logical Page | Sensing Operations for Read | Number of Sensing Operations |
|---|---|---|
| MSB | R4, R12 | 2 |
| MCSB | R2, R5, R9, R13, R15 | 5 |
| LCSB | R6, R8, R10 | 3 |
| LSB | R1, R3, R7, R11, R14 | 5 |
| MSB & LCSB | R4, R6, R8, R10, R12 | 5 |

In Table 2, the MSB page may be read by 2 sensing operations using read thresholds R4 and R14. The MCSB page may be read by 5 sensing operations using read thresholds R2, R5, R9, R13 and R15. The LCSB page may be read by 3 sensing operations using read thresholds R6, R8 and R10. The LSB page may be read by 5 sensing operations using read thresholds R1, R3, R7, R11 and R14. The MSB and LCSB pages may be read by 5 sensing operations using read thresholds R4, R6, R8, R10 and R12.

Referring again to FIG. 9, the read thresholds R1 and R15 are weak, i.e., many cells in PV0 may be read back as PV1 and vice-versa. Similarly, many cells in PV15 may be read back as PV14 and vice-versa. Embodiments of the present invention may assign these read thresholds to separate logical pages.

Figure 10:
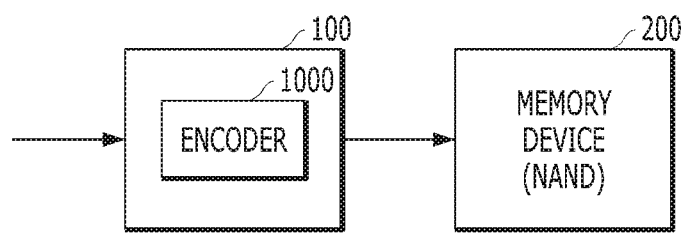
FIG. 10 is a diagram illustrating a memory system in accordance with an embodiment of the present invention.

FIG. 10 is a diagram illustrating a memory system in accordance with an embodiment of the present invention.

Referring to FIG. 10, the memory system may include a controller 100 and a memory device 200. The memory device 200 may include a NAND-type flash memory device with memory cells such as a single-level cell (SLC), a multi-level cell (MLC) a triple-level cell (TLC) or a quadruple-level cell (QLC). The controller 100 may receive a command from a host (not shown), and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command.

The controller 100 may include an encoder device 1000. During the program operation, the encoder device 1000 may perform an encoding operation on the write data based on a set encoding scheme. In various embodiments, the memory device 200 may include a NAND-type flash memory device with memory cells of a QLC (i.e., QLCs), and the encoding scheme may be related to the Gray code for mapping shown in FIG. 9. The encoding scheme will be described in below with reference to FIGS. 11 to 13. Although not described again here, the controller 100 and the memory device 200 may perform the operations described in FIGS. 1 and 2.

As described above, inter-cell interference (ICI) is most severe when a cell storing a low PV level is surrounded by cells storing a high PV level on the same word-line. The low PV level may include PV levels such as PV0, PV1, PV2 and PV3. The high PV level may include PV levels such as PV15, PV14, PV13 and PV12. To reduce the number of errors caused by such ICI, the encoding scheme may use constrained coding to eliminate all such patterns from being programmed to any word line.

Figure 11:
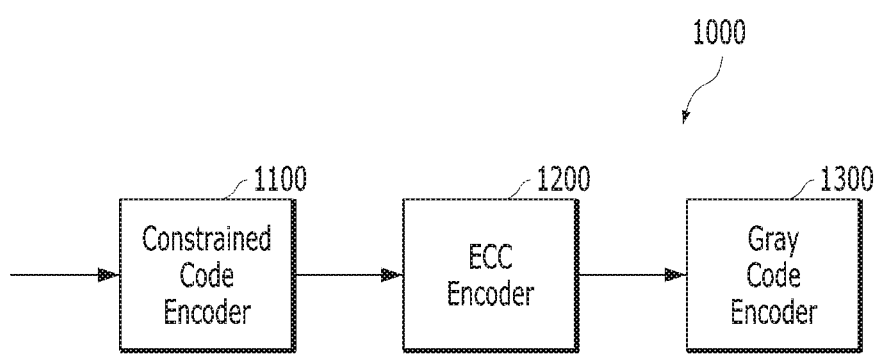
FIG. 11 is a diagram illustrating an encoder device in accordance with an embodiment of the present invention.

FIG. 11 is a diagram illustrating an encoder device in accordance with an embodiment of the present invention, for example, the encoder device 1000 of the controller 100 in FIG. 10.

Referring to FIG. 11, the encoder device 1000 may include a first encoder 1100 and a second encoder 1300. The encoder device 1000 may further include a third encoder 1200. The first encoder 1100 may perform an encoding operation based on a constrained code. The second encoder 1300 may perform an encoding operation based on a Gray code. The third encoder 1200 may perform an encoding operation based on an error correction code (ECC). The controller 100 including the encoder device 100 may control the memory device 200 to program encoded sequences, which are generated by the encoder device 100, in the memory cells of the memory device 200.

The first encoder 1100 may encode, based on the constrained code, a first group of data to generate a third group of data. The first group of data may correspond to first and third logical pages among a plurality of logical pages, which correspond to each of the quadruple-level cells (QLCs). The first encoder 1100 encodes the first group of data to generate constrained encoded data in serial.

The second encoder 1300 may encode, based on the Gray code, a second group of data and the third group of data to generate encoded sequences corresponding to 16 program-voltage (PV) levels. The second group of data may correspond to the second and fourth logical pages among the plurality of logical pages.

The third encoder 1200 may encode the second group of data and the third group of data, based on an error-correction code, respectively, to generate error corrected data for the encoding based on the Gray code.

The encoder device 100 may further include a serial-to-parallel (S/P) converter for converting the constrained encoded data into parallel encoded data for the encoding based on the error-correction code.

The third encoder 1200 may include a first group of encoders and a second group of encoders. The first group of encoders may encode first and third parallel encoded data corresponding to the first and third logical pages included in the third group of data, respectively. The second group of encoders may encode second and fourth parallel encoded data corresponding to the second and fourth logical pages included in the second group of data, respectively.

The first logical page may include the most significant bit (MSB) page. The second logical page may include the most center significant bit (MCSB) page. The third logical page may include the least center significant bit (LCSB) page. The fourth logical page may include the least significant bit (LSB) page.

The constrained code may include a code such that bits corresponding the MSB and LCSB pages, among the encoded sequences, in set low PV levels and high PV levels among the 16 PV levels have values of a certain pattern. Among the encoded sequences, the bits corresponding the MSB and LCSB pages in the set low PV levels may have values of a pattern "11". Among the encoded sequences, the bits corresponding the MSB and LCSB pages in the set high PV levels have values of a pattern "10".

Figure 12:
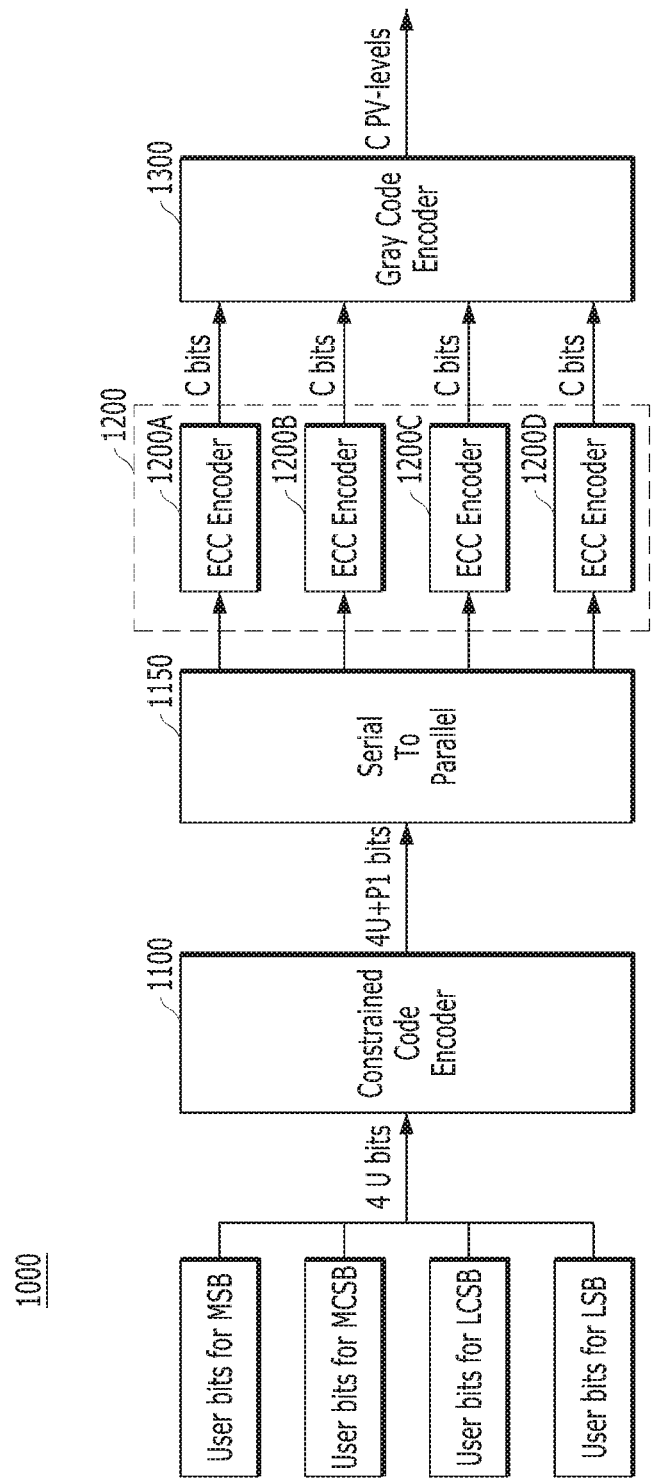
FIG. 12 is a diagram illustrating an encoder device in accordance with an embodiment of the present invention.

FIG. 12 is a diagram illustrating an encoding device in accordance with an embodiment of the present invention, for example, the encoding device 1000 of FIG. 11.

Referring to FIG. 12, the encoding device 1000 may include a first encoder 1100 and a second encoder 1300. Further, the encoder device 1000 may include a serial-to-parallel (S/P) converter 1150 and a third encoder 1200.

The first encoder 1100 may perform an encoding operation based on a constrained code. The first encoder 1100 may encode, based on the constrained code, user data (e.g., 4U bits) corresponding to a plurality of logical pages, which correspond to each of the quadruple-level cells (QLCs). The first encoder 1100 encodes the user data to generate constrained encoded data in serial. The constrained encoded data may include encoded user data (e.g., 4U bits) and parity bits (e.g., P1 bits).

In various embodiments, the plurality of logical pages may include first, second, third and fourth logical pages. The first logical page may include the most significant bit (MSB) page. The second logical page may include the most center significant bit (MCSB) page. The third logical page may include the least center significant bit (LCSB) page. The fourth logical page may include the least significant bit (LSB) page.

The serial-to-parallel (S/P) converter 1150 may convert the constrained encoded data into parallel encoded data for the encoding based on the error-correction code.

The third encoder 1200 may encode the parallel encoded data from the S/P converter 1150, based on an error-correction code, respectively, to generate error corrected data. The third encoder 1200 may include a plurality of encoders corresponding to the plurality of pages. For example, the third encoder 1200 may include 4 encoders 1200A, 1200B, 1200C and 1200D corresponding to 4 logical pages, respectively. Each of the encoders 1200A, 1200B, 1200C and 1200D may encode corresponding parallel encoded data to generate error corrected data (e.g., C bits) based on the error-correction code.

The second encoder 1300 may receive and encode error corrected data from each of the encoders 1200A, 1200B, 1200C and 1200D, based on the Gray code, to generate encoded sequences corresponding to a plurality program-voltage (PV) levels (e.g., C (=16) PV levels).

The controller 100 including the encoder device 100 may control the memory device 200 to program the encoded sequences, which are generated by the encoder device 100, in the memory cells (i.e., QLC cells) of the memory device 200.

As described above, the encoding scheme in FIG. 12 is to encode all logical pages together with a suitable constrained code in order to reduce ICI causing errors. The capacity of the constrained code that eliminates all forbidden patterns is 0.9945, i.e., at least 0.55% of the storage capacity is used to eliminate forbidden patterns. For the scheme in FIG. 12, when rate-loss due to ECC is excluded, the overall rate is at most 4×0.9945 bits/cell.

While the rate for the scheme in FIG. 12 is excellent, the random read performance may be severely degraded. This is because determining the U user bits corresponding to any logical page require the knowledge of the (4U+P1) bits at the output of the constrained code encoder 1100. Therefore, 15 sensing operations are required for determining the user bits for a single logical page.

Accordingly, a better encoding scheme is to use the properties of the Gray code mapping shown in FIG. 9. In accordance with the Gray code mapping in FIG. 9, whether a cell is storing a low PV level or a high PV level or neither may be identified by its bits corresponding to MSB and LCSB pages alone. Table 3 below shows the mapping between the low and high PV levels and the bits corresponding to the MSB and LCSB pages.

TABLE 3

| Type of PV level | Bit corresponding to MSB | Bit corresponding to LCSB |
|---|---|---|
| Low | 1 | 1 |
| High | 1 | 0 |

Then the constrained code only needs the information of MSB and LCSB pages to eliminate the forbidden patterns. A structure of encoder device in accordance with this scheme is shown in FIG. 13.

Figure 13:
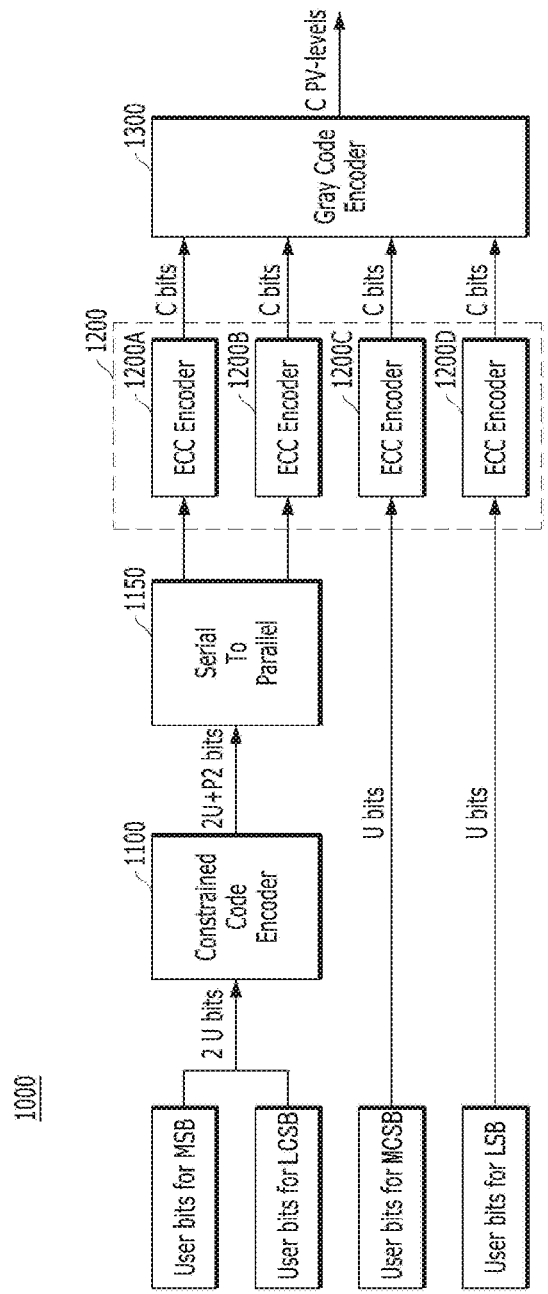
FIG. 13 is a diagram illustrating an encoder device in accordance with an embodiment of the present invention.

FIG. 13 is a diagram illustrating an encoding device in accordance with an embodiment of the present invention, for example, the encoding device 1000 of FIG. 11.

Referring to FIG. 13, the encoding device 1000 may include a first encoder 1100 and a second encoder 1300. The encoder device 1000 may further include a serial-to-parallel (S/P) converter 1150 and a third encoder 1200.

The first encoder 1100 may perform an encoding operation based on a constrained code. The first encoder 1100 may encode, based on the constrained code, a first group of data to generate a third group of data. The first group of data may correspond to first and third logical pages among a plurality of logical pages, which correspond to each of the quadruple-level cells (QLCs).

In various embodiments, the plurality of logical pages may include first, second, third and fourth logical pages. The first logical page may include the most significant bit (MSB) page. The second logical page may include the most center significant bit (MCSB) page. The third logical page may include the least center significant bit (LCSB) page. The fourth logical page may include the least significant bit (LSB) page.

The first group of data may include user data (e.g., 2U bits) corresponding to MSB and LCSB logical pages. The first encoder 1100 may encode the first group of data to generate the third group of data as constrained encoded data in serial. The constrained encoded data may include encoded user data (e.g., 2U bits) and parity bits (e.g., P2 bits)

The constrained code may include a code such that bits corresponding the MSB and LCSB pages in set low PV levels and high PV levels among the 16 PV levels have values of a certain pattern. Among encoded sequences, which is generated and output by the encoder device 1000, the bits corresponding the MSB and LCSB pages in the set low PV levels may have values of a pattern "11". Among the encoded sequences, the bits corresponding the MSB and LCSB pages in the set high PV levels have values of a pattern "10".

The serial-to-parallel (S/P) converter 1150 may receive the third group of data as the constrained encoded data from the first encoder 1100, and convert the constrained encoded data into parallel encoded data for the encoding based on the error-correction code. The third group of data as the constrained encoded data may include encoded user data (e.g., 2U bits) and parity bits (e.g., P2 bits).

The third encoder 1200 may receive and encode a second group of data, and the parallel encoded data from the S/P converter 1150, based on an error-correction code, respectively, to generate error corrected data for the encoding based on the Gray code. The second group of data may include user data (e.g., U bits) corresponding to MCSB logical page, and user data (e.g., U bits) corresponding to LSB logical page.

The third encoder 1200 may include a plurality of encoders corresponding to the plurality of pages. For example, the third encoder 1200 may include 4 encoders 1200A, 1200B, 1200C and 1200D corresponding to 4 logical pages, respectively. The encoders 1200A and 1200B may be a first group of encoders, and the encoders 1200C and 1200D may be a second group of encoders. Error correction codes for the first group of encoders have different code rates from error correction codes for the second group of encoders. The first group of encoders may encode first and third parallel encoded data corresponding to the first and third logical pages included in the third group of data, respectively. The second group of encoders may encode user data corresponding to the second and fourth logical pages included in the second group of data, respectively. Each of the encoders 1200A, 1200B, 1200C and 1200D may encode corresponding data to generate error corrected data (e.g., C bits) based on the error-correction code.

The second encoder 1300 may receive and encode error corrected data from each of the encoders 1200A, 1200B, 1200C and 1200D, based on the Gray code, to generate encoded sequences corresponding to a plurality program-voltage (PV) levels (e.g., C (=16) PV levels).

The controller 100 including the encoder device 100 may control the memory device 200 to program the encoded sequences, which are generated by the encoder device 100, in the memory cells (i.e., QLC cells) of the memory device 200.

As described above, the MSB and the LCSB pages are encoded together using the constrained code encoder 1100. The constrained bits at the output of the encoder 1100 as well as the unconstrained bits from the MCSB and LSB pages are then encoded using an error-correction code (ECC) to correct any errors in the read-back data. The ECC encoded sequences are then used to determine the PV levels to be programmed to all memory cells (e.g., NAND cells) in a certain word line.

Unlike the encoding scheme in FIG. 12 where all logical pages are encoded together, the encoding scheme in FIG. 13 may decode MCSB pages and LSB pages independently with 5 sensing operations. Moreover, determining either the MSB page or the LCSB page requires the knowledge of (2U+P2) bits, which also require 5 sensing operations. This balanced number of reads is possible due to the optimized design of Gray code in FIG. 9. The optimal number of sensing operations for any Gray code if no constrained coding is performed is 4. Thus, the encoding scheme in FIG. 13 achieves elimination of ICI causing harmful patterns with small increase in sensing operations and low rate-loss.

The scheme in FIG. 13 shows a concatenation of constrained code and error correcting code. In an alternative embodiment, it is possible to use the concatenation architecture where the user data is first encoded with ECC and the resulting codeword is then encoded using constrained code. Moreover, it is possible to design other Gray codes that hold the same properties that were used in the scheme according to embodiments of the present invention, namely ability to identify low and high PV levels with two logical pages, balanced number of sensing operations to read logical pages, and balanced number of weak sensing thresholds.

As the foregoing describes, embodiments of the present invention provide a scheme for mapping program-voltage (PV) levels of a quadruple-level cell (QLC) memory cell into four logical pages, such that the logical pages are balanced in the number and quality of the sensing operations required to perform a read operation. Moreover, the chosen Gray mapping allows identification of harmful inter-cell interference (ICI) patterns using only two out of the four logical pages.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including quadruple-level cells (QLCs); and
   a controller including:
   a first encoder suitable for encoding, based on a constrained code, a first group of data to generate a third group of data, the first group of data corresponding to first and third logical pages among a plurality of logical pages; and
   a second encoder suitable for encoding, based on a Gray code, a second group of data and the third group of data to generate encoded sequences corresponding to a plurality of program-voltage (PV) levels, the second group of data corresponding to the second and fourth logical pages among the plurality of logical pages,
   wherein the constrained code operates such that the third group of data excludes any pattern in which a bit of a QLC having a low program-voltage is directly between two bits, each of a QLC having a high program-voltage.

2. The memory system of claim 1, wherein the controller controls the memory device to program the encoded sequences in the memory cells.

3. The memory system of claim 1, further comprising:
   a third encoder suitable for encoding the second group of data and the third group of data, based on an error-correction code, respectively, to generate error corrected data for the encoding based on the Gray code.

4. The memory system of claim 3, wherein the first encoder encodes the first group of data to generate a serial output of constrained encoded data.

5. The memory system of claim 4, further comprising:
   a serial-to-parallel converter suitable for converting the serial output of the constrained encoded data into parallel encoded data for the encoding based on the error-correction code.

6. The memory system of claim 4, wherein the third encoder includes:
   a first group of encoders for encoding first and third parallel encoded data corresponding to the first and third logical pages included in the third group of data, respectively; and
   a second group of encoders for encoding second and fourth parallel encoded data corresponding to the second and fourth logical pages included in the second group of data, respectively.

7. The memory system of claim 1, wherein the first logical page includes the most significant bit (MSB) page,
   the second logical page includes the most center significant bit (MCSB) page,
   the third logical page includes the least center significant bit (LCSB) page, and
   the fourth logical page includes the least significant bit (LSB) page.

8. The memory system of claim 7, wherein the constrained code includes a code such that bits corresponding the MSB and LCSB pages, among the encoded sequences, in low PV levels and high PV levels among 16 PV levels have values of a certain pattern.

9. The memory system of claim 8, wherein the bits corresponding the MSB and LCSB pages, among the encoded sequences, in the low PV levels have values of a pattern "11".

10. The memory system of claim 9, wherein the bits corresponding the MSB and LCSB pages, among the encoded sequences, in the high PV levels have values of a pattern "10".

11. A method for operating a memory system including a memory device including quadruple-level cells (QLCs), the method comprising:
    encoding, based on a constrained code, a first group of data to generate a third group of data, the first group of data corresponding to first and third logical pages among a plurality of logical pages; and
    encoding, based on a Gray code, a second group of data and the third group of data to generate encoded sequences corresponding to a plurality of program-voltage (PV) levels, the second group of data corresponding to the second and fourth logical pages among the plurality of logical pages,
    wherein the constrained code operates such that the third group of data excludes any pattern in which a bit of a QLC having a low program-voltage is directly between two bits, each of a QLC having a high program-voltage.

12. The method of claim 11, further comprising:
    programming the encoded sequences in the quadruple-level cells of the memory device.

13. The method of claim 11, further comprising:
    encoding the second group of data and the third group of data, based on an error-correction code, respectively, to generate error corrected data for the encoding based on the Gray code.

14. The method of claim 13, wherein the encoding of the first group of data comprises encoding the first group of data to generate a serial output of constrained encoded data.

15. The method of claim 14, further comprising:
    converting the serial output of the constrained encoded data into parallel encoded data for the encoding based on the error-correction code.

16. The method of claim 14, wherein the encoding based on the error-correction code comprises:
    encoding first and third parallel encoded data corresponding to the first and third logical pages included in the third group of data, respectively; and
    encoding data corresponding to the second and fourth logical pages included in the second group of data, respectively.

17. The method of claim 11, wherein the first logical page includes the most significant bit (MSB) page,
    the second logical page includes the most center significant bit (MCSB) page,
    the third logical page includes the least center significant bit (LCSB) page, and the fourth logical page includes the least significant bit (LSB) page.

18. The method of claim 17, wherein the constrained code includes a code such that bits corresponding the MSB and LCSB pages, among the encoded sequences, in low PV levels and high PV levels among 16 PV levels have values of a certain pattern.

19. The method of claim 18, wherein the bits corresponding the MSB and LCSB pages, among the encoded sequences, in the low PV levels have values of a pattern "11".

20. The method of claim 19, wherein the bits corresponding the MSB and LCSB pages, among the encoded sequences, in the high PV levels have values of a pattern "10".

* * * * *